(12) United States Patent
Kirn

(10) Patent No.: US 6,781,453 B2
(45) Date of Patent: Aug. 24, 2004

(54) METHOD OF DETECTING LOAD IMPEDANCE FOR INDUCTIVE BOOST AMPLIFIER

(75) Inventor: Larry Kirn, East Lansing, MI (US)

(73) Assignee: JAM Technologies, LLC, Boston, MA (US)

( * ) Notice: Subject to any disclaimer, the term of this patent is extended or adjusted under 35 U.S.C. 154(b) by 0 days.

(21) Appl. No.: 10/128,047

(22) Filed: Apr. 23, 2002

(65) Prior Publication Data

US 2002/0175750 A1 Nov. 28, 2002

Related U.S. Application Data

(60) Provisional application No. 60/285,785, filed on Apr. 23, 2001.

(51) Int. Cl.[7] .............................. H03F 3/38; H03F 3/217
(52) U.S. Cl. ...................... 330/10; 530/207 A; 530/251
(58) Field of Search .............................. 330/10, 207 A, 330/251, 146

(56) References Cited

U.S. PATENT DOCUMENTS 5,126,684 A * 6/1992 Solomon ...................... 330/10
5,422,597 A * 6/1995 Stengel et al. ................ 330/10
5,438,694 A * 8/1995 Muri et al. .................... 330/10
6,388,514 B1 * 5/2002 King et al. .................... 330/10

\* cited by examiner

Primary Examiner—Khanh Van Nguyen
(74) Attorney, Agent, or Firm—Gifford, Krass, Groh, Sprinkle, Anderson & Citkowski, PC

(57) ABSTRACT

A method of enhancing the performance of an inductive boost amplifier includes the steps of detecting the specific load impedance being drive by the amplifier, and adjusting the operation of the amplifier to accommodate the detected load impedance. Various load impedances may be connected to the improved amplifier while accommodating the impedance of different amplifier loads subject to change under various conditions such as temperature, voltage, frequency, etc. Thus, in addition to compensation of static load impedance variances, the present invention is quite effective in compensating for dynamic variances as well. Although the description focuses on variable load impedance compensation, it is anticipated that simpler implementations of the technique may be used to selectively switch output filter components into operation in response to specific load impedance ranges, yielding a similar, albeit coarser, net result. The invention may be used as well to regulate other amplifier functions, such as back-EMF shunt timing, and other circuits.

4 Claims, 1 Drawing Sheet

METHOD OF DETECTING LOAD IMPEDANCE FOR INDUCTIVE BOOST AMPLIFIER

REFERENCE TO RELATED APPLICATION

This application claims priority from U.S. provisional patent application Ser. No. 60/285,785, filed Apr. 23, 2001, the entire contents of which is incorporated herein by reference.

FIELD OF THE INVENTION

This invention relates generally to switching amplifiers and, in particular, to a method and apparatus for detecting the specific load impedance being driven by an inductive boost amplifier and using that information to modify amplifier perfromance.

BACKGROUND OF THE INVENTION

Switching amplifiers, by their nature, usually introduce undesirable switching frequency components at their outputs unless low pass filters are employed. These filters are usually passive designs, sensitive to the load impedance being driven. As it is not always possible to predict the exact load impedance that an amplifier will ultimately statically or dynamically drive, the possibility exists that the actual load impedance will deviate significantly from that assumed in the design.

The resultant filter mismatch results therefore in poor amplifier performance. Furthermore, timing relationships based on load impedance in an inductive boost amplifier are compromised by load variances, resulting in distortion products. A need therefore exists for a mechanism to allow acceptable switching amplifier performance over a range of load impedances.

SUMMARY OF THE INVENTION

The present invention resides in a method and associated apparatus for detecting the specific load impedance being driven by an inductive boost amplifier, and using that information to modify amplifier operation.

Various load impedances may be connected to the improved amplifier while accommodating the impedance of different amplifier loads subject to change under various conditions such as temperature, voltage, frequency, etc. Thus, in addition to compensation of static load impedance variances, the present invention is quite effective in compensating for dynamic variances as well.

Although the description focuses on variable load impedance compensation, it is anticipated that simpler implementations of the technique may be used to selectively switch output filter components into operation in response to specific load impedance ranges, yielding a similar, albeit coarser, net result. The invention may be used as well to regulate other amplifier functions, such as back-EMF shunt timing, and other circuits.

DETAILED DESCRIPTION OF THE INVENTION

Figure 1:
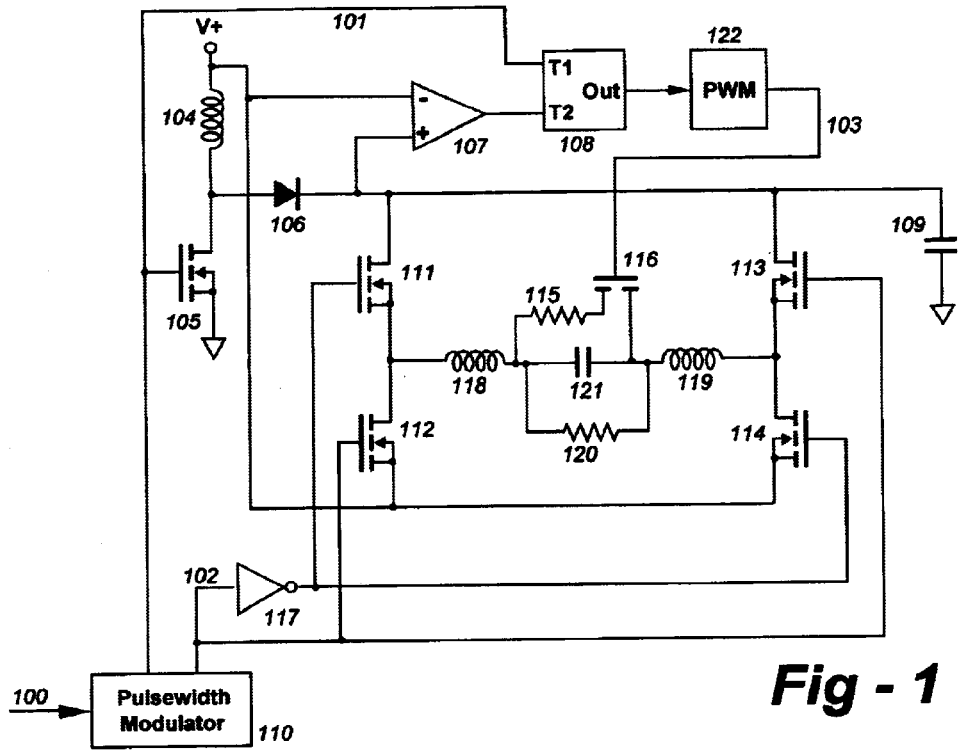
FIG. 1 is a circuit diagram showing a preferred embodiment of the present invention used to stabilize the output filter roll-off frequency of an inductive boost amplifier.

Referring now to FIG. 1, incoming data stream 100 is converted into pulse-width modulated signal 101 and sign signal 102 by pulse-width modulator 110. Energy is stored in inductor 104 when charged by switching device 105 under control of PWM voltage 101.

When switching device 105 is turned OFF, the stored energy is released through diode 106, limited by capacitor 109, and applied to load 121 through either switching device 111 or switching device 113, under control of sign voltage 102 and inverter 117. In this manner, the desired output polarity at load 121 is effected.

Inductors 118 and 119, and capacitor 120 serve to remove switching components from the energy supplied to load 121. Return path for the non-driven side of load 121 is provided by either switching device 112 or switching device 114, under control of voltage 102 and inverter 117. Although shown as a fixed resistance, amplifier loads are typically reactive and exhibit back-EMP, resulting in variable impedance.

In that inductor 104 is constant, and assuming a small value of capacitor 109, the time constant to discharge inductor 104 is relatively unaffected by load 121, since the instantaneous resistance of capacitor 109 is much lower than load 121. The time for energy to be transferred from capacitor 109 to load 121, however, is essentially determined by the peak voltage at capacitor 109, the value of capacitor 109, and the relatively constant current flowing through inductors 118 and 119. The average peak magnitude of this voltage is essentially a function of the value of inductor 104, the ON time of switching device 105, the value of capacitor 109, and the load impedance 121.

Note that, while current and voltage are in phase, the voltage at capacitor 109 decays at a rate determined by the peak voltage, but in a constant time. The time during which the voltage at the cathode of diode 106 exceeds the power supply V+ therefore is a function of the current in inductors 118 and 119 (determined by load impedance 121), as is indicated by an assertion at the output of comparator 107.

Timer 108 measures the time interval from the falling edge of PWM control signal 101 (indicating discharge of inductor 104) to the falling edge of comparator 107 output (indicating voltage at capacitor 109 falling below V+). This time interval so measured represents the combined charge and discharge times of capacitor 109. In that the charge time of capacitor 109 is relatively unaffected, as noted above, by the value of load 121, the variable portion of the time measured by timer 108 primarily reflects variances in the discharge time of capacitor 109 brought about by variances in load 121.

The output of timer 108 drives pulse-width modulator 122, which outputs a pulse width directly proportional to its input. Hence, as the discharge time of capacitor 109 increases, as caused by increased impedance of load 121, the PWM output signal 103 increases duty cycle. The PWM signal directly activates switching device 116 which, when activated, shunts load 121 with resistance 115. Thus, the higher duty cycle of output 103, caused by increased capacitor 109 discharge time, increases average shunt current through switching device 116 and resistor 115, lowering the effective impedance of load 121. The output impedance of the filter formed by inductors 118 and 119, in conjunction with capacitor 120, is thereby stabilized.

Figure 2:
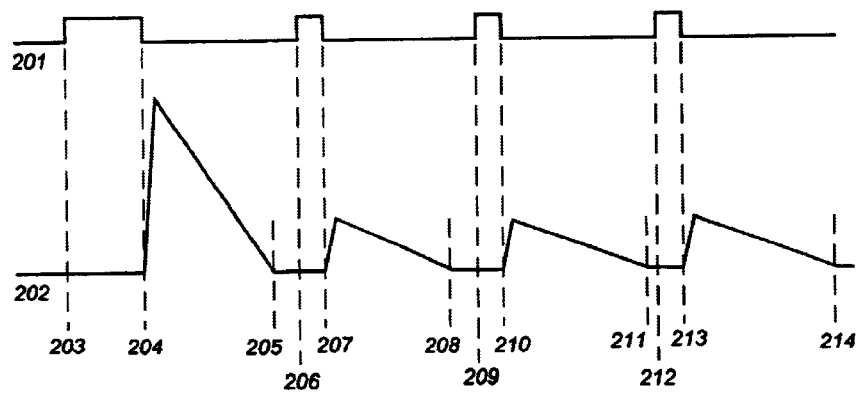
FIG. 2 shows voltage waveforms of the circuitry of FIG. 1 as the load impedance increases.

For the sake of efficiency, it is assumed that the pulse width output by PWM converter 122 will be calibrated to approach zero duty cycle when the capacitor 109 discharge time indicative of the lowest desired load impedance 121 is seen. Referring now to FIG. 2, waveform 201 depicts the pulse width modulated signal 101 of FIG. 1 and waveform 202 depicts the voltage at capacitor 109, also of FIG. 1. All components noted in describing FIG. 2 refer to those designated in FIG. 1.

At time 203, signal 101 is asserted, causing switching device 105 to develop current in inductor 104. At time 204, signal 101 is de-asserted, allowing the charge stored in inductor 104 to transfer to capacitor 109 and eventually dissipate through inductor 118 and 119 ultimately into load 121. Note that inductor 118 and 119 maintain a relatively constant current, resulting in a linear voltage decay proportional to the peak voltage of capacitor 109.

At time 205, capacitor 109 is seen to be depleted. At time 206, switching device 105 is again asserted, with a shorter duration. At the subsequent switching device 105 de-assertion time 207, capacitor 109 voltage can again be seen to rise, but to a smaller voltage, proportional to the duration of signal 101. Note, however, that the following capacitor 109 discharge from time 207 to time 208 is the same duration of the previous cycle from time 204 to lime 205. Due to the constant current characteristic noted earlier of inductors 118 and 119.

For the remainder of FIG. 2, it is assumed that load 121 increases in impedance. Note that after signal 101 assertion from time 209 to time 210, resultant capacitor 109 discharge interval from time 210 to time 211 increases, due to increasing load 121. With increasing load 121 thereafter, signal 101 assertion from time 212 to 213 results in an even longer capacitor 109 discharge from time 213 to time 214. This increase in discharge time is indicated by comparator 107 of FIG. 1, as described above. Measurement of capacitor discharge times as described herein therefore provides an accurate indicator of specific average load impedance through a switching cycle.

It is noted that various load impedances may be connected to the amplifier, and that the impedance of different amplifier loads change under various conditions such as temperature, voltage, frequency, etc. In addition to compensation of static load impedance variances, it is seen that the present invention is quite effective in compensating dynamic variances as well.

Although variable load impedance compensation is effected herein, it is anticipated that simpler implementations of the technique described herein will selectively switch output filter components into operation in response to specific load impedance ranges, yielding a similar, albeit coarser, net result. It will be further appreciated that impedance information gleaned by the present invention may be used as well to regulate other amplifier functions, such as back-EMF shunt timing, etc.

I claim:

1. A method of enhancing the performance of an inductive boost amplifier, comprising the steps of:
    detecting the specific load impedance being drives by the amplifier; and
    adjusting the output timing or filtering of the amplifier as a function of the detected load impedance.

2. The method of claim 1, wherein the step of adjusting the output timing or filtering is done in response to a static load impedance variation.

3. The method of claim 1, wherein the step of adjusting the output timing or filtering is done as a result of a dynamic load impedance variation.

4. The method of claim 3, wherein the dynamic load impedance variation is caused by temperature, voltage, frequency, or some combination thereof.

* * * * *